May 4, 1965 R. E. MYER 3,182,267

LINEAR DETECTOR CIRCUIT

Filed Sept. 10, 1962 2 Sheets-Sheet 1

INVENTOR
R. E. MYER
BY
Walter M. Hill
ATTORNEY

May 4, 1965 R. E. MYER 3,182,267

LINEAR DETECTOR CIRCUIT

Filed Sept. 10, 1962 2 Sheets-Sheet 2

INVENTOR
R. E. MYER
BY Walter M. Hill
ATTORNEY

United States Patent Office 3,182,267 Patented May 4, 1965

3,182,267

LINEAR DETECTOR CIRCUIT

Robert E. Myer, Denville, N.J., assignor to Bell Telephone Laboratories, Incorporated, New York, N.Y., a corporation of New York Filed Sept. 10, 1962, Ser. No. 222,716
8 Claims. (Cl. 329—205)

This invention relates to linear detectors and more particularly to a circuit means for improving the linearity of diode detectors.

Strictly linear operation of a diode detector has been recognized for many years as a desired ideal to be achieved. Progress toward achieving this objective has generally consisted of improving the detector diode itself. Nonlinearity of operation is generally attributed to the nonlinearity of the diode volt-ampere characteristic, which nonlinearity becomes most pronounced at low current levels. Unfortunately, it is in the region of low current that linear diode operation is most desired and improvements of the detector element itself have so far not achieved satisfactory linearity for some applications. It has become common practice to slightly forward bias the detector to avoid the more pronounced nonlinear or "square-law" region. A simple circuit means, preferably operative at higher frequencies in the megacycle region is needed to supplement the improvements that have been made in the detector element itself.

It is the object of this invention to improve the linearity of diode detector operation, particularly at low current levels.

The foregoing object is achieved by this invention which comprises a circuit means which includes the diode as substantially the sole effective load of an amplifier so that as the diode resistance changes with changing current level, the gain of the amplifier is caused to change, thereby compensating for the changing diode resistance. Means are included to initially bias the detector to zero volts in the absence of an input signal.

The invention may be better understood by reference to the accompanying drawings, in which.

Figure 3:
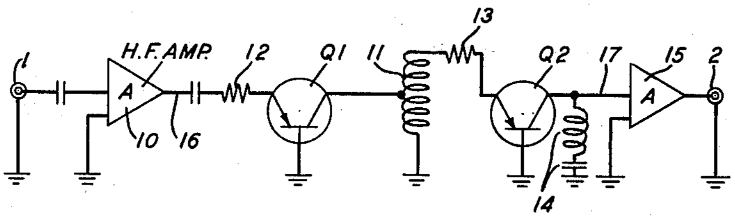
Figure 4:
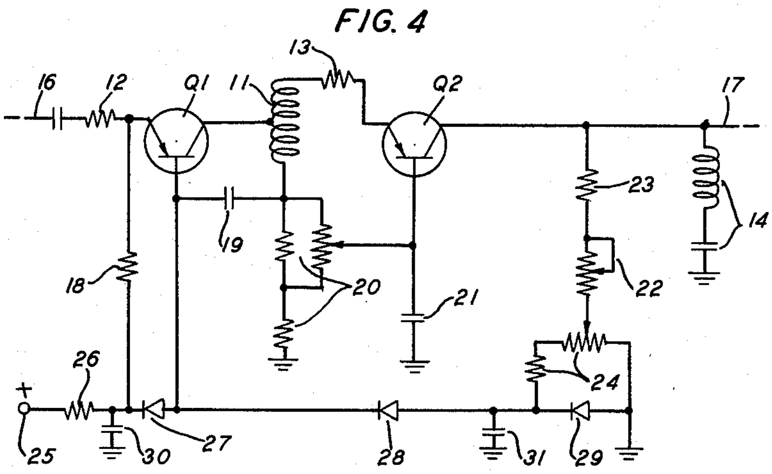
Figure 5:
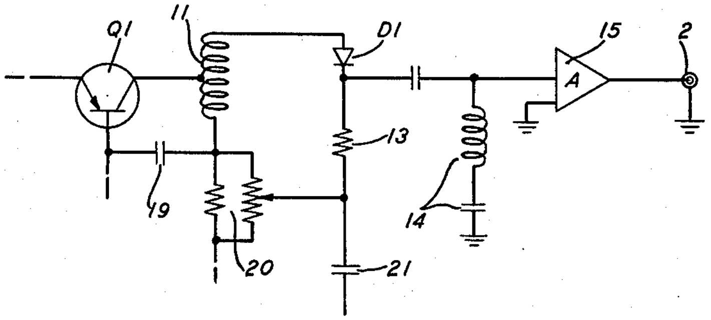
Figure 6:
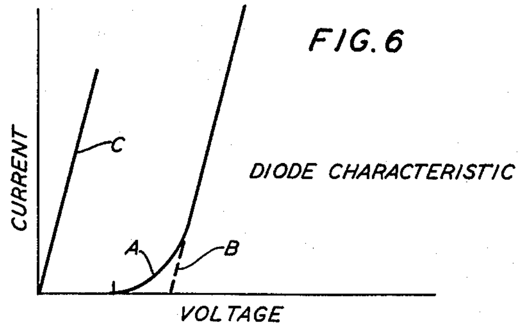

FIG. 3 discloses another embodiment of the invention employing transformer coupling to the detector diode to minimize the effect of shunt capacitance at higher frequencies;

FIG. 4 discloses a practical circuit arrangement for the bias supplies which may be used with the circuit of FIG. 3;

FIG. 5 discloses a modification of FIGS. 3 and 4 in which a simple diode is used as the detector; and FIG. 6 discloses a diode characteristic showing the character of improvement afforded by this invention.

Figure 1:
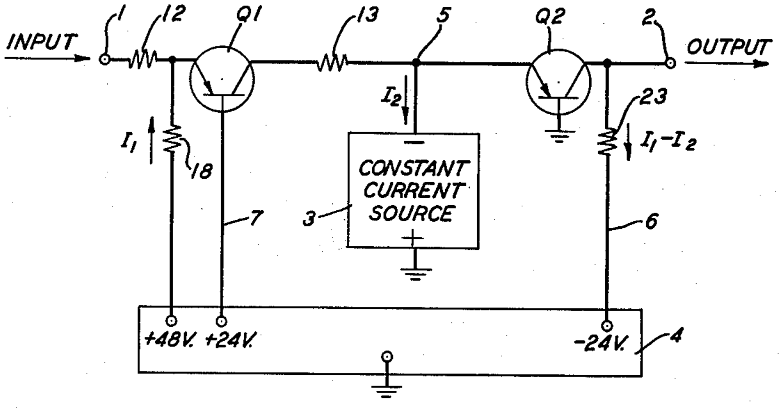
FIG. 1 illustrates one preferred embodiment of the invention particularly suitable for operation at frequencies below 5 megacycles.

In FIG. 1 a modulated carrier signal may be impressed between input terminal 1 and ground. This signal is amplified by the transistor Q1 and is detected by the diode junction comprising the emitter and base of transistor Q2. The input signal is impressed on the emitter of transistor Q1 through a series resistor 12 while the base is grounded by way of conductor 7 through the twenty-four-volt terminal of a conventional power supply 4. The emitter is biased by connection, through resistor 18, to the forty-eight-volt terminal of the same power supply. The collector of transistor Q1 is connected to the emitter of transistor Q2 by way of series resistor 13, this emitter also being connected to ground through a constant current source 3 poled as shown. The collector and base of transistor Q2 are connected into an output circuit leading to output terminal 2 and including a resistor 23 connected to the negative twenty-four-volt terminal of the power supply by way of conductor 6. Under these bias conditions the collector current of transistor Q1 will be approximately equal to its emitter current so that current $I_1$ flowing through resistor 18 will be essentially the collector current for this transistor when the signal voltage on terminal 1 is zero.

The circuit parameters are so adjusted that the current $I_1$ through resistor 18 will just equal the current $I_2$ supplied by the constant current source 3. The effect of such an adjustment is to bring terminal 5, connected to the emitter of transistor Q2, to ground potential so that no current flows through the emitter-base junction of this transistor. As previously indicated, this junction comprises the detector diode. With the circuit so adjusted, it will be evident that the signal currents supplied to input terminal 1 will be added to the current $I_1$ and will so appear in the collector circuit of transistor Q1. Since the constant current source 3 will permit the flow of only current $I_2$, transistor Q1, which acts as a current driver, drives this signal current through the emitter-base junction of transistor Q2, causing this diode to comprise virtually the sole load for the signal current supplied by the driver transistor Q1. Transistor Q2 also acts as an amplifier so that a replica of this detected current will appear in its output circuit.

The diode junction resistance is inherently variable as a function of current, particularly at low current levels, so that it is essential that the effect of this changing resistance be minimized if there is to be any improvement in detector linearity. In this invention, the diode constitutes essentially the sole dynamic load in the output circuit of the driver transistor Q1 so that the voltage gain of the amplifier is made to increase as the diode resistance increases. The net effect is that this variable gain is caused to substantially compensate for the effect of the variable diode resistance to make the diode current, and so also the collector current of Q2, to vary substantially linearly with the signal voltage on terminal 1.

Figure 2:
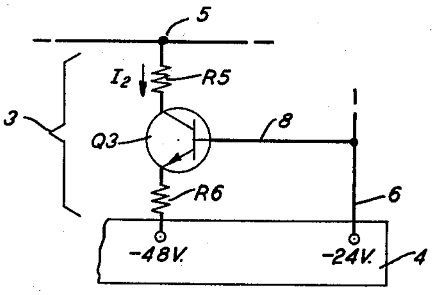
FIG. 2 is illustrative of a constant current source which may be used with the circuit of FIG. 1.

FIG. 2 discloses a preferred type of constant current source 3 which may be substituted for the source 3 shown in FIG. 1. In this circuit, transistor Q3 has its base connected to the negative twenty-four-volt terminal of the power supply by way of conductors 8 and 6. The collector is connected to terminal 5 by way of resistor R5 and the emitter is connected through resistor R6 to the negative forty-eight-volt terminal of power supply 4. As this is a conventional type of constant current circuit involving negative feedback, further description thereof is believed unnecessary.

The circuit of FIG. 1 operates with greatly improved linearity up to frequencies in the order of 5 megacycles. However, as the frequency is increased above 5 megacycles, the shunt capacitance of the collector circuit of transistor Q1 begins to affect the circuit operation. This can be minimized by employing a transformer coupling in the manner to be described with reference to FIGS. 3, 4 and 5.

The circuit in FIG. 3 embodies essentially the same principles as the circuit of FIG. 1 insofar as the diode constituting substantially the sole effective load on the driver amplifier is concerned. In this figure, the input signal is first amplified by a conventional high frequency amplifier 10, the output circuit 16 of which is capacity coupled to the emitter of the driver transistor Q1 through resistor 12. The collector circuit of driver transistor Q1 is coupled by means of transformer 11 to the emitter-base circuit of transistor Q2 through a resistor 13. The emitter-base junction of transistor Q2 comprises the detector diode. The effect of transformer 11 is to cause the detector circuit to present a much lower impedance to the collector circuit of transistor Q1, thereby minimizing the effect of its shunt capacitance in a manner well known. The detected signal appearing in the collector circuit of transistor Q2 is fed to the output circuit 2 by way of conductor 17 and a second amplifier 15. The carrier component is conveniently eliminated by a suitable wave trap 14 of conventional design.

The principles of FIG. 3 are also embodied in the circuit of FIG. 4 which shows a practical embodiment of this invention with suitable power supplies for the two transistors. This circuit may be inserted in FIG. 3 by connection to conductors 16, 17 and ground. The positive pole of a direct current supply is connected to terminal 25 so that current flows through resistor 26 and the three serially connected Zener diodes 27, 28 and 29. The lower end of resistor 18 is grounded for signal currents by way of by-pass capacitor 30. The base of transistor Q1 is grounded through this capacitor and the low impedance of Zener diode 27. Parallel ground paths also may be traced through diodes 28 and 29 and capacitor 31. The lower terminal of transformer 11 is grounded by way of by-pass capacitor 19 and the power supply. Capacitor 21 grounds the base of transistor Q2. A voltage divider circuit 20 provides an adjustment for removing a small residual bias on the diode junction comprising the emitter and base of transistor Q2. The current supply to divider 20 is obtained by the direct current path from the upper end of capacitor 30, through resistor 18, through the emitter-to-collector path of transistor Q1, the lower end of transformer 11 and through the divider network to the grounded side of the power supply. The voltage divider network 24, connected across Zener diode 29, is provided to adjust the output signal voltage at terminal 2 in FIGS. 3 and 5 to zero in the absence of an input signal. Current is supplied to divider 24 by reason of the virtual source created by Zener diode 29. Rheostat 22, in series with resistor 23, is connected across the collector circuit of transistor Q2 to provide a convenient means of adjusting the gain of transistor Q2.

While it is very desirable and preferred that the diode to be used as a detector be a part of a transistor in the manner heretofore shown, it is not absolutely essential that this be done. In fact, a workable circuit may be constructed by using a conventional diode suitable for high frequency detection purposes. This diode may be connected into the circuit in the manner shown in FIG. 5. In this case, the series resistor 13 is connected on the opposite side of the diode junction, formed by a simple diode D1. As before, the primary circuit of transformer 11 is connected to the output circuit of transistor Q1 while the secondary is connected in series with the detector diode and resistor 13. Since the diode in this case is not part of a transistor, the detected output is derived from the voltage drop across resistor 13 which, in most applications, should be of relatively low resistance, preferably in the order of 10 to 100 ohms. This output is capacity coupled to amplifier 15 and to the output terminal 2. The remainder of the circuit is the same as shown for FIGS. 3 and 4.

The improvement provided by this invention is illustrated in FIG. 6. The detector characteristic of a conventional diode is known to be highly nonlinear at low signal levels. This is illustrated in FIG. 6 by the curve A. By causing the diode to comprise essentially the sole load on the driver amplifier and by so proportioning the circuit parameters that the amplifier gain is caused to increase as the diode resistance increases, a marked improvement in detector linearity is obtained. This improvement is illustrated by the dotted characteristic B shown in FIG. 6. Because the invention includes means biasing the diode to zero volts under zero signal conditions, the effective diode characteristic is better represented by characteristic C where the circuit output current is plotted as a function of the input signal voltage. It has been determined, from tests of practical circuits, that characteristic C still has a very slight curvature near the origin but this can only be illustrated by plotting the characteristic in the region of the origin on greatly expanded current and voltage scales.

From the foregoing description it will be quite evident that the principal requirements for the practice of this invention is that the circuits including the detector diode shall be so arranged that the diode forms virtually the sole load presented to the output circuit of the driving amplifier and that the gain of the driving amplifier be largely dependent upon the diode impedance. The effect of this is to cause the overall amplifier gain to increase as the diode resistance increases, thereby tending to cause the diode current to become far more nearly a linear function of the input voltage to the amplifier. Also, the diode circuit should include a means for biasing the diode to substantially zero volts in the absence of an input signal. Various circuit modifications embodying these principles will be evident to those skilled in this art.

What is claimed is:

1. A linear detector circuit comprising a diode having an inherent nonlinear voltage-current characteristic, means biasing said diode to substantially zero voltage in the absence of an input signal, an amplifier having an input circuit and an output circuit, said input circuit including means for connection to a source of modulated carrier frequency signals to be detected, said diode being connected to the output circuit to comprise essentially the sole effective load for said amplifier at said carrier frequency, whereby the overall amplifier gain is caused to change with current through said diode to compensate the detector characteristic for the nonlinearity of said diode.

2. The combination of claim 1 wherein said amplifier comprises a transistor connected in grounded base configuration.

3. The combination of claim 1 and an amplifier coupled to said diode to amplify the detected output therefrom.

4. The combination of claim 1 wherein said diode comprises the base-emitter junction of a transistor.

5. The combination of claim 4 wherein said transistor is connected as an amplifier in grounded base configuration.

6. A linear detector circuit comprising a driver stage and a detector stage, each comprising a transistor having an emitter, a base and a collector, the emitter and the base of said detector stage comprising a detector diode, means for impressing the signal to be detected between the emitter and base of said driver stage, an output circuit connected between the base and collector of said detector stage, means providing substantially zero bias to said diode in the absence of a signal, and means so coupling the collector of the driver stage to the emitter of the detector stage that the instantaneous current caused to flow in said diode is substantially linearly proportional to the instantaneous amplitude of the signal.

7. The combination of claim 6 wherein the means coupling the collector of the driver stage to the emitter of the detector stage comprises a resistor connected directly between said collector and emitter and a constant current source is connected to said emitter, and said means providing zero bias comprises a current source connected to the emitter of the driver stage adjusted to deliver a current equal to that of said constant source whereby no current flows through said diode in the absence of a signal.

8. The combination of claim 6 wherein the means coupling the collector of the driver stage to the emitter of the detector stage comprises a transformer.

References Cited by the Examiner

UNITED STATES PATENTS

| | | | |
|---|---|---|---|
| 2,941,070 | 6/60 | Barry | 329—192 |
| 3,012,136 | 12/61 | Kubota | 329—101 |

ROY LAKE, *Primary Examiner.*